United States Patent
Kwon

(10) Patent No.: US 8,853,026 B2
(45) Date of Patent: Oct. 7, 2014

(54) SEMICONDUCTOR DEVICE HAVING DEEP WELLS AND FABRICATION METHOD THEREOF

(71) Applicant: Dongbu Hitek Co., Ltd., Seoul (KR)

(72) Inventor: Kyung Wook Kwon, Incheon (KR)

(73) Assignee: Dongbu Hitek Co., Ltd., Seoul (KR)

( * ) Notice: Subject to any disclaimer, the term of this patent is extended or adjusted under 35 U.S.C. 154(b) by 0 days.

(21) Appl. No.: 13/796,315

(22) Filed: Mar. 12, 2013

(65) Prior Publication Data

US 2014/0246762 A1    Sep. 4, 2014

(30) Foreign Application Priority Data

Mar. 4, 2013   (KR) .................. 10-2013-0023047

(51) Int. Cl.
*H01L 21/8238* (2006.01)
*H01L 21/266* (2006.01)
*H01L 29/06* (2006.01)

(52) U.S. Cl.
CPC .......... *H01L 21/266* (2013.01); *H01L 29/0684* (2013.01)
USPC ........... 438/228; 438/223; 438/370; 438/373; 438/514

(58) Field of Classification Search
USPC .......... 438/223, 224, 227, 228, 369–374, 514
See application file for complete search history.

(56) References Cited

U.S. PATENT DOCUMENTS

| 6,066,522 A * | 5/2000 | Hirase ........................... 438/228 |
| 2001/0000288 A1* | 4/2001 | Oh ................................ 257/409 |

FOREIGN PATENT DOCUMENTS

JP           05-175441         7/1993

OTHER PUBLICATIONS

Office Action dated Feb. 5, 2014, in Korean Application No. 10-2013-0023047, filed Mar. 4, 2013.

* cited by examiner

*Primary Examiner* — Thien F Tran
(74) *Attorney, Agent, or Firm* — Saliwanchik, Lloyd & Eisenschenk

(57) ABSTRACT

Semiconductor devices and methods of fabricating the same are provided. An insulating film can be disposed on a semiconductor substrate, and insulating film patterns can be formed opening a plurality of areas with predetermined widths by patterning the insulating film. A plurality of ion implantation areas having a first conductivity type can be formed by implanting impurities into the plurality of open areas, and an oxide film pattern can be formed on each of the ion implantation areas. The insulating film patterns can be removed, and ion implantation areas having a second conductivity type can be formed by implanting impurities using the oxide film pattern as a mask. The semiconductor substrate can be annealed at a high temperature to form deep wells.

14 Claims, 6 Drawing Sheets

US 8,853,026 B2

SEMICONDUCTOR DEVICE HAVING DEEP WELLS AND FABRICATION METHOD THEREOF

CROSS-REFERENCE TO RELATED APPLICATION

This application claims the benefit under 35 U.S.C. §119 of Korean Patent Application No. 10-2013-0023047, filed Mar. 4, 2013, which is hereby incorporated by reference in its entirety.

BACKGROUND

A high-voltage semiconductor device used for, e.g., an LCD driver IC (LDI), a PDP driver IC, a flash memory, or EEPROM, needs to have high junction breakdown voltage. To this end, the high-voltage semiconductor device may be formed in a deep well with low doping distribution.

The well used for the high-voltage semiconductor device may be formed as a diffused well that uses well drive-in by high energy ion implantation and high-temperature, long-duration thermal treatment.

Recently, in order to obtain a high net number of dies with a small chip in a wafer, the size of a device has been gradually decreasing from 0.25 μm to 0.18 μm, and then to 0.13 μm and 0.11 μm. Thus, an important goal is to maintain the same performance while simultaneously reducing the size of the device. In addition, an analog output property is required that is compatible with a low-voltage process and enables excellent driving of a display panel.

FIGS. 1A and 1B are views of depths of such high-voltage diffused wells according to open areas of the diffused wells. Referring to FIG. 1A, as the open area widens, a depth of a well through ion implantation also increases and then remains at a constant level. Referring to FIG. 1B, in the process of manufacturing a semiconductor device, as the open area widens, a device is generally manufactured with an area corresponding to an increased depth level of the diffused well.

FIGS. 2A to 2D are cross-sectional views of general processes for forming wells of a semiconductor device according to a related art.

Referring to FIG. 2A, a nitride film 102 is disposed on a P-doped substrate 100. A photoresist pattern (not shown) is formed on the nitride film 102, and the nitride film 102 is etched by using the photoresist pattern. Subsequently, the nitride film 102 implants N-type ions into an open area to form a deep N well 105, and the photoresist pattern is removed.

Referring to FIG. 2B, an oxide film 110 is formed on a deep N well 105, and the remaining nitride film 102 is removed. Subsequently, P-type ions are implanted on both sides of the oxide film 110 by using the oxide film 110 as a hard mask to form a deep P well 107. Referring to FIG. 2C, if well-drive-in is performed on the deep N well 105 and the deep P well 107 through a long annealing process, a diffused well of a semiconductor is formed.

However, referring to FIG. 2D, after forming the deep N well 105 and the deep P well 107, a process of forming a photoresist pattern on the wells must be performed to form a different conductivity type of another well in the N and P wells as shown. Thus, there are limitations, in that processes become complex and the manufacturing cost increases due to usage of a further mask.

BRIEF SUMMARY

Embodiments of the subject invention provide a deep well of a semiconductor device and a method of fabricating the same that simplifies processes by using a small number of masks in forming a well. This can be accomplished through N-type ion implantations that are operable at a high voltage, such as equal to or greater than 30 V by using a 0.11 μm standard process.

In an embodiment, a method of fabricating a semiconductor device can include: disposing an insulating film on a semiconductor substrate; forming insulating film patterns opening a plurality of areas with predetermined widths by patterning the insulating film; forming a plurality of first ion implantation areas having a first conductivity type by implanting first impurities having the first conductivity type into the plurality of open areas; forming an oxide film pattern on each of the first ion implantation areas; removing the insulating film patterns; forming second ion implantation areas having a second conductivity type by implanting second impurities having the second conductivity type using the oxide film pattern as a mask; and annealing the semiconductor substrate at a high temperature, The first conductivity type can be different from the second conductivity type.

In another embodiment, a semiconductor device can include: a substrate; a first deep well having a first conductivity type formed in the substrate; and a second deep well having a second conductivity type formed in the first well. A depth of the second deep well can be less than that of the first deep well, and the depth of the second deep well can be at least 18 μm.

DETAILED DESCRIPTION

Reference will now be made in detail to the embodiments of the present disclosure, examples of which are illustrated in the accompanying drawings.

When the terms "on" or "over" are used herein, when referring to layers, regions, patterns, or structures, it is understood that the layer, region, pattern, or structure can be directly on another layer or structure, or intervening layers, regions, patterns, or structures may also be present. When the terms "under" or "below" are used herein, when referring to layers, regions, patterns, or structures, it is understood that the layer, region, pattern, or structure can be directly under the other layer or structure, or intervening layers, regions, patterns, or structures may also be present.

FIGS. 3A to 3D are cross-sectional views of a method of forming a deep well of a semiconductor device according to an embodiment of the subject invention.

Figure 3A:
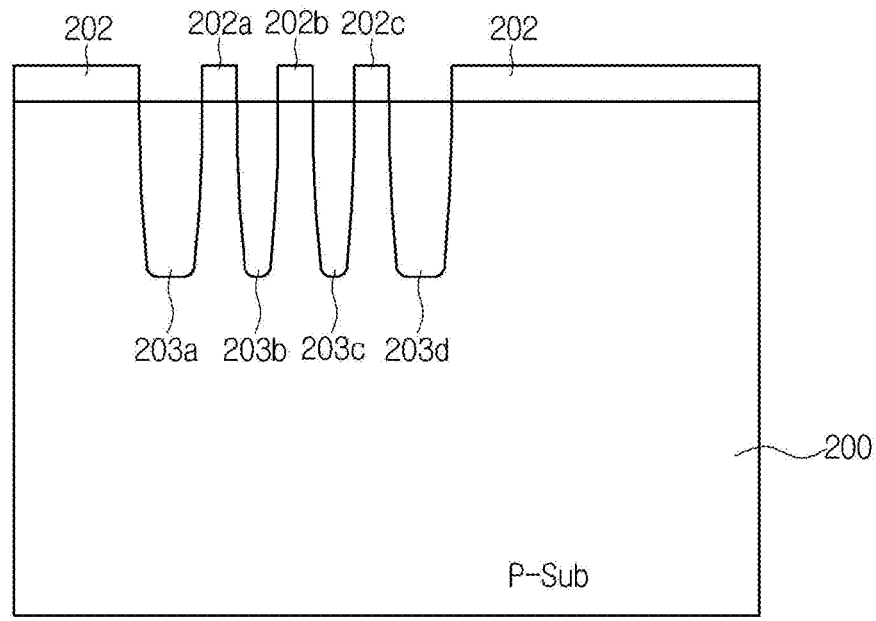
FIGS. 3A to 3D are cross-sectional views of a method of forming a deep well of a semiconductor device according to an embodiment of the subject invention.

Referring to FIG. 3A, an insulating film 202 can be disposed on a P-doped semiconductor substrate 200, a photoresist pattern (not shown) can be deposited on the insulating film 202, and then a photoresist pattern (not shown) opening a high-voltage well forming area can be formed through exposure and development processes. Though insulating film 202 is depicted as a nitride film, embodiments are not limited thereto.

Nitride film patterns 202a,202b, 202c can be formed by etching the lower nitride film 202 of the photoresist pattern. Subsequently, an N-type impurity can be ion-implanted on the high-voltage well-forming area opened by the nitride film patterns 202a to 202c. Deep N well (DNWELL) areas 203a, 203b, 203c, 203d can be present on the semiconductor substrate 200 in the same quantity as that of areas opened by the photoresist pattern.

Subsequent to removing the photoresist pattern remaining on the nitride film patterns 202a to 202c (e.g., by performing a wet etching process), the nitride film patterns 202a to 202c on the semiconductor substrate 200 can be selectively etched (e.g., by performing reactive ion etching).

An etched thickness can be adjusted to allow the nitride film patterns 202a to 202c to maintain a predetermined thickness. The nitride film patterns 202a to 202c inhibit out-diffusion of an N-type ion and, thus, even if any subsequent thermal treatment processes are performed, there may be no impact on another device used in the thermal processes because the N-type ion implanted into silicon may not make out-diffusion.

Figure 3B:
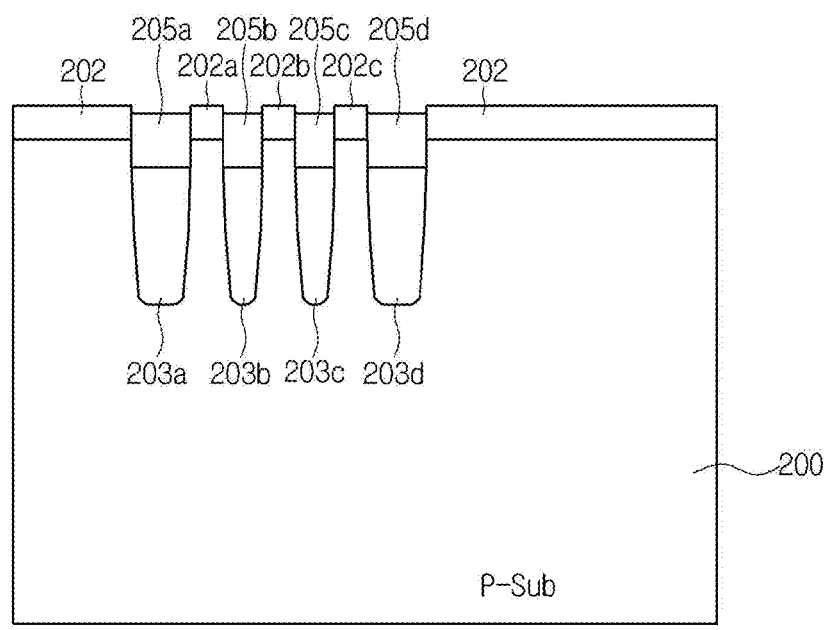

Referring to FIG. 3B, oxide film patterns 205a, 205b, 205c, 205d with a predetermined thickness can be formed on each of the areas opened by the nitride film patterns 202a to 202c, namely, DNWELL areas 203a to 203d. The oxide film pattern can be formed by any suitable process known in the art, for example, by performing thermal oxidation.

Figure 3C:
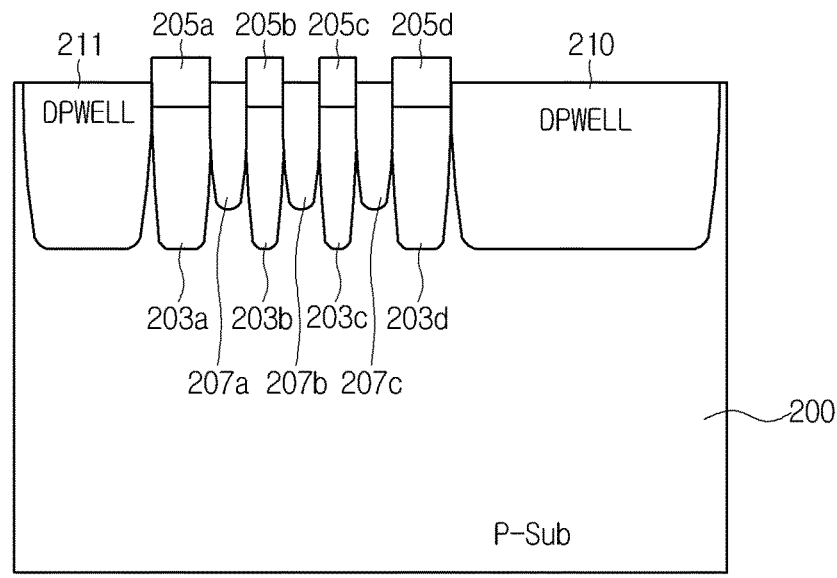

Referring to FIG. 3C, the nitride film patterns 202a to 202c remaining on the semiconductor substrate 200 can be removed, e.g., through a reactive ion etching process. By removing the nitride film patterns 202a to 202c, areas opened by the oxide film patterns 205a to 205d can be formed on the substrate 200.

P well (DPWELL) areas can be formed on the areas opened by each of the oxide films 205a to 205d through the process of implanting a P-type impurity. That is, DPWELL areas (211, 207a, 207b, 207c, 210) can be formed by the oxide film patterns 205a to 205d. In this case, since an area not opened by the nitride film pattern can have a relatively long line width, ions can be deeply implanted to form the DPWELLs 210 and 211.

Figure 3D:
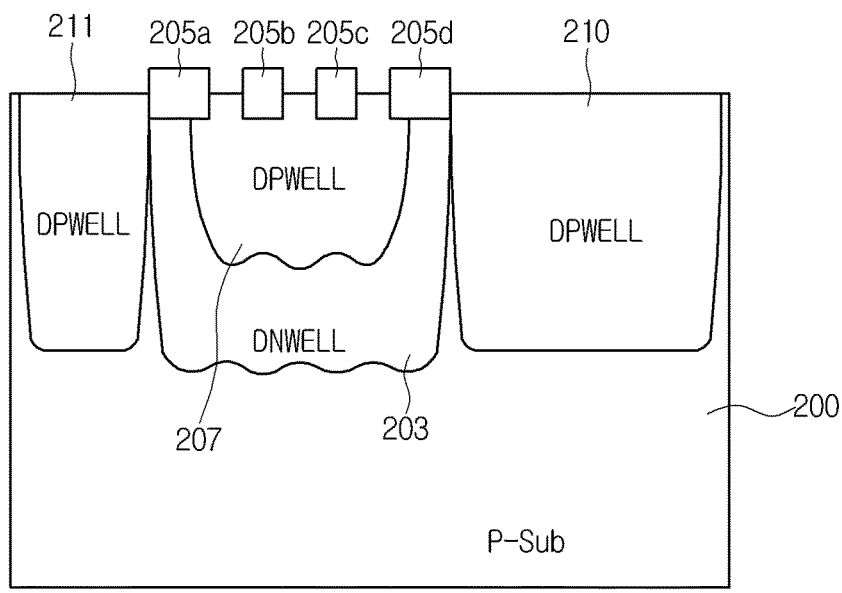

Referring to FIG. 3D, a drive-in process can be performed on the DPWELLs 211, 207a to 207c, and 210. In an embodiment, the drive-in process can be performed by thermal treatment, for example, at a temperature of about 1150° C. for about 2 hours. Impurities ion-implanted by the drive-in process are diffused in the semiconductor substrate 200 to form the DNWELL 203 and the DPWELLs 211, 210, and 207.

Each of the DNWELLs 203a to 203d can be formed as one DNWELL 203 due to diffusion of impurities by an annealing process, and the DPWELLs 207a to 207c ion-implanted between the DNWELLs 203a to 203d can also be formed as one DPWELL 207 due to diffusion of impurities by the annealing process.

Devices that operate at different voltages from those of devices formed on the DPWELLs 211 and 210 adjacent to the semiconductor substrate can be formed on the DPWELL 207 in the DNWELL 203.

Figure 1A:
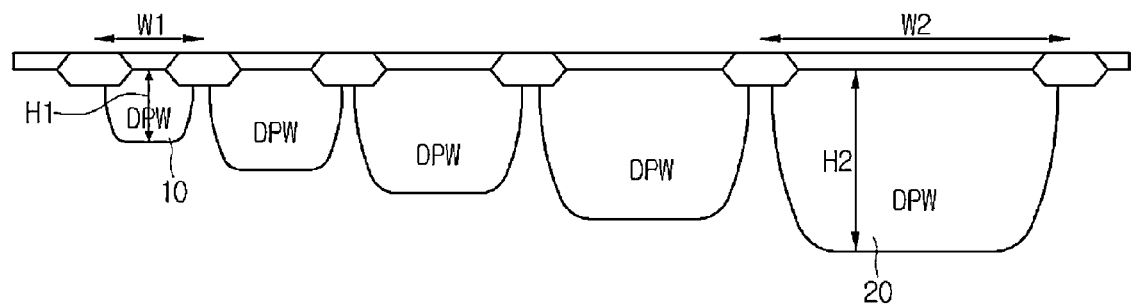
FIG. 1A is a cross-sectional view of changes in a width and a depth of a deep P well.
Figure 1B:
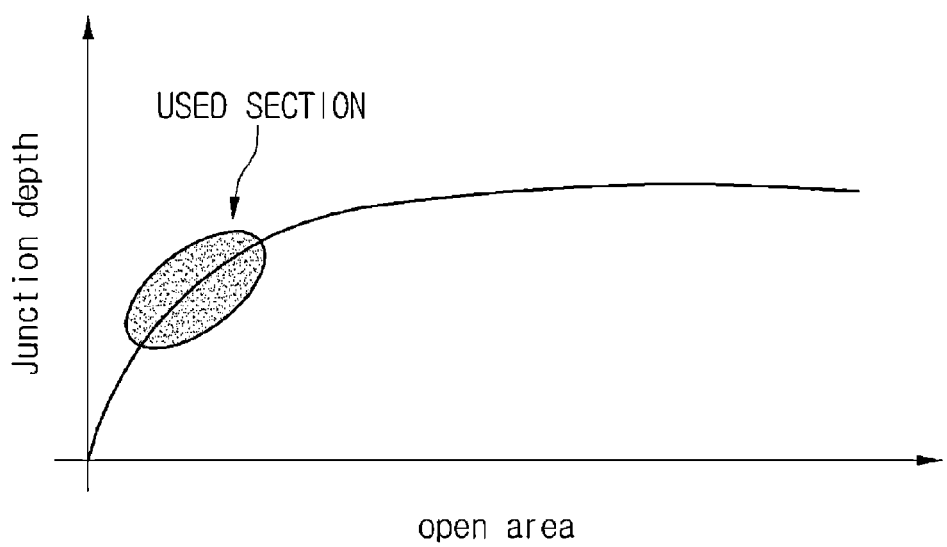
FIG. 1B is a graph of changes in a width and a depth of a deep P well.
Figure 2A:
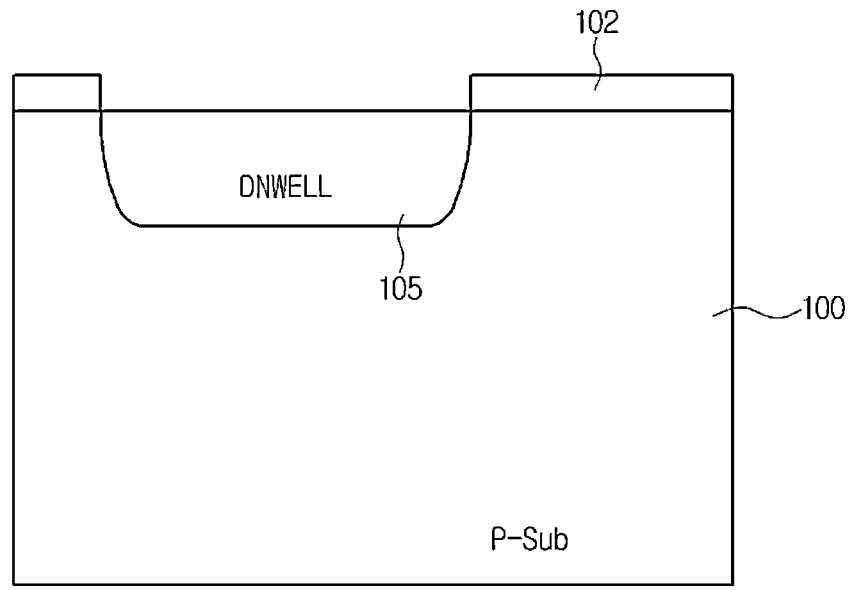
FIGS. 2A to 2D are cross-sectional views of a related art method of forming a deep well of a semiconductor device.
Figure 2B:
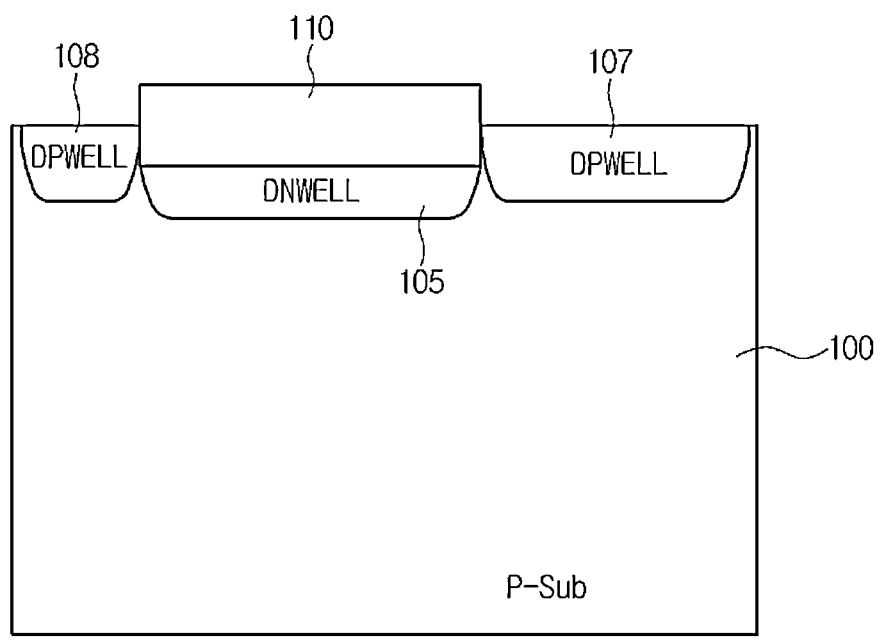
Figure 2C:
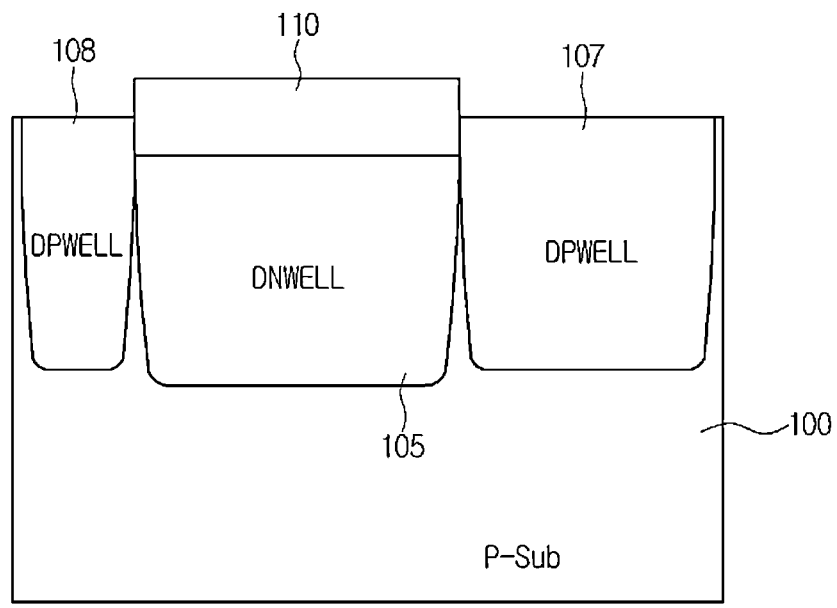
Figure 2D:
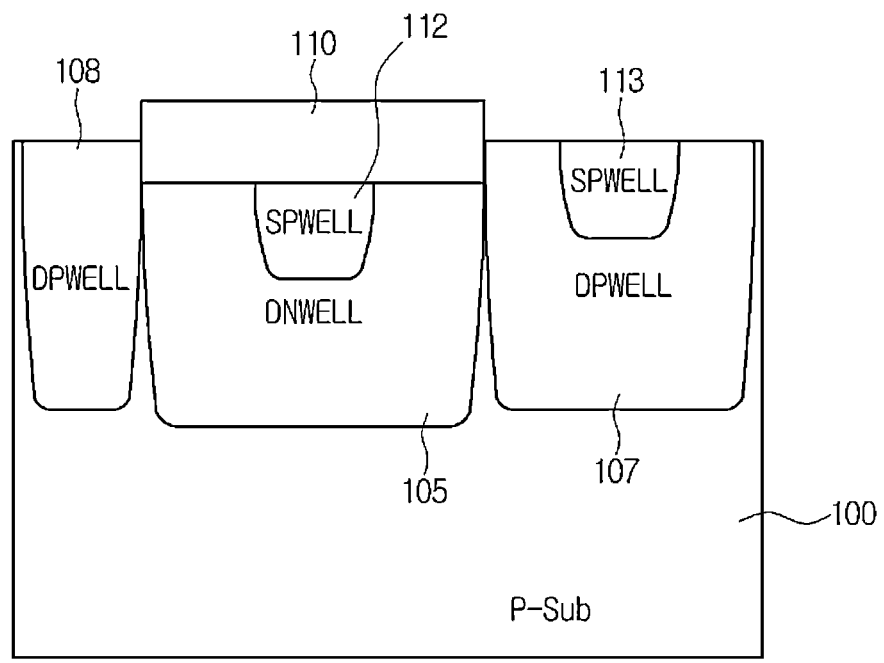

In certain embodiments of the subject invention, areas on which the nitride film patterns 202, and 202a to 202c are formed correspond to areas on which P wells are subsequently formed, and areas on which the oxide film patterns 205a to 205d are formed correspond to areas on which deep N wells are subsequently formed. As discussed with respect to FIG. 1, as open areas of each of the nitride film patterns 202, and 202a to 202c widen, a depth of a well subsequent to an ion implantation process increases. Thus, the distance between the nitride film patterns 202, and 202a to 202c can preferably be formed to be wider than that between the oxide film patterns 205a to 205d.

A layout of the P well can be formed by selecting the number of areas opened when forming the photoresist patterns deposited on the nitride film in FIG. 3A.

However, there may be a case where the DPWELLs and DNWELLs do not merge even if DPWELLs and DNWELLs diffuse in a drive-in process. Typically, as a length of an open area forming a DPWELL increases, a depth and a surface density of the DPWELL increase. If the open area is formed to be equal to or greater than 10 μm in length, there may be a limitation in that a separation is not made inside the DNWELL but a connection to a P-type semiconductor substrate is made.

Thus, in order for a plurality of P wells and a plurality of N wells to be formed as one well through diffusion, it is preferable that the distance between the open areas of the nitride film patterns is formed to be equal to or less than 10 μm. If a line width for forming a deep P well is open to be equal to or greater than 10 μm, it can typically be difficult to form a separate deep P well in a deep N well. However, referring again to FIGS. 3C and 3D, according to embodiments of the subject invention, it is surprisingly possible to form a deep P well, having a depth equal to or greater than 18 μm, in a deep N well. This can be accomplished, e.g., by combining a plurality of P well patterns 207a to 207c, each with a line width equal to or less than 10 μm.

Figure 4A:
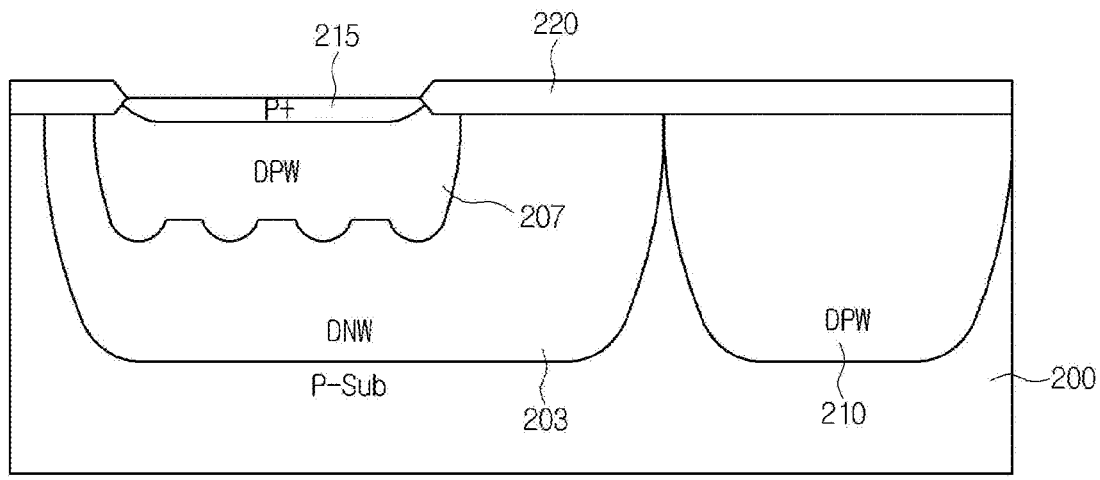
FIG. 4A is a cross-sectional view of a layout of a semiconductor device according to an embodiment of the subject invention.

FIG. 4A is a cross-sectional view of a layout of a semiconductor device according to an embodiment of the subject invention.

Referring to FIG. 4A, although not shown, it is possible to form a transistor by forming a gate insulating film (not shown), a gate electrode (not shown), and source and drain regions (not shown) on a semiconductor substrate 200 on which wells 211, 203, 207, and 210 and a device separating film are formed. A high-density P-type conductive connecting area 215 can be formed on the deep P well 207 and connected to the gate electrode.

Figure 4B:
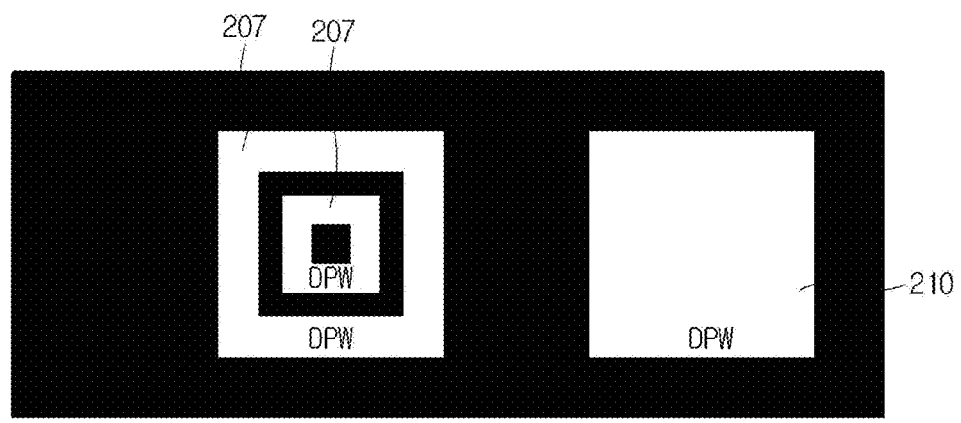
FIG. 4B is a plane view of a layout of a semiconductor device according to an embodiment of the subject invention.

FIG. 4B is a plane view of a layout of a semiconductor device according to an embodiment of the subject invention.

Referring to FIG. 4B, a deep P well area can be formed in a deep N well by forming photoresist patterns in a successive square shape on a nitride film 202 disposed on the semiconductor substrate 200 and opening only an area 207 in which a deep P well is formed.

Although a deep P well area which is formed in the photoresist pattern of the layout has been described herein for exemplary purposes, embodiments are not limited thereto. For example, it is possible to form a deep well in one deep N well by performing an annealing process on a plurality of deep N wells and a plurality of deep P wells, in a nitride film pattern formed in a photoresist pattern.

Although a P-type semiconductor substrate has been described herein for exemplary purposes, embodiments are not limited thereto. For example, it is possible to use an N-type semiconductor substrate. If an N-type semiconductor substrate is used, it is possible to first form a P-type well and then an N-type well and in this case, it is possible to form an N-type well in the P-type well.

In several embodiments, it is possible to form a deep P well 207 in a deep N well 203 subsequent to performing a process of forming a photoresist pattern on a silicon nitride film 202 only once.

According to embodiments of the subject invention, processes can be advantageously simplified because there is no need for a photo patterning process to form a different conductivity-type well in a deep well of a semiconductor. Also, costs can be decreased because it is possible to form a well without a further mask.

In addition, embodiments of the subject invention advantageously and surprisingly allow formation of a separate deep P well with a predetermined size equal to or greater than a certain value in a deep N well. Existing techniques cannot accomplish this. Embodiments of the subject invention allow formation of a deep P well with an increased line width in a deep N well (or a deep N well with an increased line width in a deep P well) by forming nitride film patterns for the deep P well and the deep N well.

While embodiments have been described in detail above, it will be obvious to those skilled in the art that the present invention is not limited by the embodiments described above and the accompanying drawings, and several replacements, variations, and changes are possible without departing from a technical spirit of the present invention.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

What is claimed is:

1. A method of fabricating a semiconductor device, the method comprising:
    disposing an insulating film on a semiconductor substrate;
    forming insulating film patterns opening a plurality of areas with predetermined widths by patterning the insulating film;
    forming a plurality of first ion implantation areas having a first conductivity type by implanting first impurities having the first conductivity type into the plurality of open areas;
    forming an oxide film pattern on each of the first ion implantation areas;
    removing the insulating film patterns;
    forming second ion implantation areas having a second conductivity type by implanting second impurities having the second conductivity type using the oxide film pattern as a mask; and
    annealing the semiconductor substrate at a high temperature,
    wherein the first conductivity type is different from the second conductivity type.

2. The method according to claim 1, wherein forming the oxide film pattern comprises performing a thermal oxidation process.

3. The method according to claim 1, wherein annealing the semiconductor substrate at the high temperature comprises:
    forming a first deep well, having the first conductivity type, through diffusion of the first impurities of the first ion implantation areas; and
    forming a second deep well, having the second conductivity type, through diffusion of the second impurities of the second ion implantation areas.

4. The method according to claim 3, wherein the second deep well is formed in the first deep well.

5. The method according to claim 4, wherein the first conductivity type is N-type, and wherein the second conductivity type is P-type.

6. The method according to claim 5, wherein the semiconductor substrate is a P-type substrate.

7. The method according to claim 4, wherein the first conductivity type is P-type, and wherein the second conductivity type is N-type.

8. The method according to claim 7, wherein the semiconductor substrate is an N-type substrate.

9. The method according to claim 4, wherein a depth of the second deep well is less than that of the first deep well.

10. The method according to claim 9, wherein the depth of the second deep well is at least 18 µm.

11. The method according to claim 4, wherein each of the second ion implantation areas that form the second deep well through diffusion has a line width of less than 10 µm prior to annealing the semiconductor substrate.

12. The method according to claim 1, wherein a distance between the oxide film patterns is 10 µm or less.

13. The method according to claim 1, wherein a distance between the insulating film patterns is greater than that between the oxide film patterns.

14. The method according to claim 1, wherein the insulating film is a nitride film.

* * * * *